United States Patent [19]

Yeh et al.

[11] Patent Number: 5,411,563
[45] Date of Patent: May 2, 1995

[54] STRENGTHENING OF MULTILAYER CERAMIC/GLASS ARTICLES

[75] Inventors: Tsung-Shou Yeh; Jane-Chyi Lin, both of Hsinchu; Shiang-Po Hwang, Tainan, all of Taiwan, Prov. of China

[73] Assignee: Industrial Technology Research Institute, Hsinchu, Taiwan, Prov. of China

[21] Appl. No.: 82,670

[22] Filed: Jun. 25, 1993

[51] Int. Cl.⁶ ............................................. C03B 19/06
[52] U.S. Cl. ................................... 65/17.3; 65/17.6; 156/89; 264/58; 264/61
[58] Field of Search ................. 156/89; 65/18.1, 18.3, 65/17.3, 17.6; 264/58, 61

[56] References Cited

U.S. PATENT DOCUMENTS

| | | | |
|---|---|---|---|
| 3,189,978 | 6/1965 | Stetson | 65/18.3 |
| 3,649,440 | 3/1972 | Mogles . | |
| 3,852,877 | 12/1974 | Ahn et al. | 264/58 |
| 3,988,405 | 10/1976 | Smith et al. | 65/18.3 |
| 4,218,512 | 8/1980 | Allersma | 428/410 |
| 4,341,543 | 7/1982 | Andrus et al. | 65/30.1 |
| 4,642,148 | 2/1987 | Kurihara et al. | 156/89 |
| 4,726,981 | 2/1988 | Pierson et al. | 428/212 |
| 4,781,970 | 11/1988 | Barbee et al. | 428/210 |
| 4,880,684 | 11/1989 | Boss et al. | 156/89 |
| 4,971,932 | 11/1990 | Alpha et al. | 501/3 |
| 5,110,442 | 5/1992 | Kojima et al. | 264/61 |
| 5,141,899 | 8/1992 | Jean et al. | 156/89 |
| 5,145,540 | 9/1992 | Foley et al. | 156/89 |

*Primary Examiner*—Joye L. Woodard
*Attorney, Agent, or Firm*—W. Wayne Liauh

[57] ABSTRACT

A method for preparing strengthened ceramic/glass substrates by laminating and sintering multiple layers of ceramic/glass precursory substrates having different thermal expansion coefficients, with the inner layer having higher thermal expansion coefficient and the outer layers having lower thermal expansion coefficient. After the sintered substrates are cooled, a compressive stress will be permanently imparted in the sintered substrates which will be exerted onto the surface layer thereof. Such a compressive stress has the effect of impeding the growth of any defects and thus provides the strengthening effect. The method disclosed in the present invention can be used to strengthen ceramic/-glass substrates that contain electronic parts or conductor circuits.

12 Claims, 1 Drawing Sheet

STRENGTHENING OF MULTILAYER CERAMIC/GLASS ARTICLES

FIELD OF THE INVENTION

This invention relates to a method for strengthening ceramic/glass articles and the strengthened ceramic/glass article made therefrom. More particularly, this invention relates to a process by which a compressive stress is permanently imparted into ceramic/glass articles during the manufacturing process therefor to impede the growth of any surface defects and thereby improve the strength of ceramic/glass articles and prevent the ceramic/glass articles from cracking.

BACKGROUND OF THE INVENTION

Composite ceramic/glass substrates have recently seen rapidly increased applications in the electric/electronic industries. Ceramic/glass composite substrates, by definition, comprise primarily a glass matrix with fine ceramic particulate fillers distributed therewithin. Since glass constitutes the major part of the ceramic/glass substrates, the type and composition of the glass component determine the basic properties of the substrates. On the other hand, ceramic fillers are added to change or improve the physical and/or chemical properties of the substrate. By changing the types and compositions of glass and ceramic components, as well as the proportions thereof, a ceramic/glass substrate can be tailored to suit a particular application.

In the manufacturing of multichip modulus in the electronic packaging industry, for example, the glass component used in making the ceramic/glass composite in a multilayer ceramic substrate can be selected from the family of glass materials with low dielectric constant and low thermal expansion-coefficient, such as borosilicate glass; and the ceramic fillers can be selected from a variety of ceramic materials such as fused silica, cordierite, forsterite, aluminum oxide etc. The proportions between the glass and the ceramic components can be properly adjusted so that the composite materials can be sintered and densifted at temperatures between 800° and 1,000° C. The ceramic/glass composite can be used in conjunction with conductor circuit made from low-melting point and low-resistivity metals, such as gold, silver, copper, etc, to form multilayer ceramic substrates, which exhibit low dielectric constant and with a thermal expansion coefficient close to that of silicon chips. These multilayer ceramic substrates can be made to achieve the same high packaging density, high wiring density and high reliability as silicon chips. With a proper design, ceramic/glass based multilayer substrates can bring the benefits of reducing the delay in signal transfer in the substrate as well as the noise level produced therefrom. With these advantages, ceramic/glass based multilayer substrates can be produced which meet the stringent specifications required for use in large mainframe computers as well as in super computers.

Composite ceramic/glass substrates can also be used in the manufacturing of hard memory discs for storing data in computers. One of the advantages thereof is that excellent flatness can be obtained due to the ability of softened glass material to lay flat at elevated temperatures. Fine ceramic particles can be added to the glass matrix to form surface protrusions with heights ranging from tens to hundreds of angstroms. Composite ceramic/glass substrates allow the production of high-hardness and high-flatness hard disc substrates to be therefrom with appropriate surface texture. Other advantages of using ceramic/glass composite materials include a simplified procedure in the manufacturing of hard discs, and the increased density of the discs made therefrom for storing more data therein per unit area.

Due to their low thermal expansion coefficient and excellent thermal shock resistance, some glass materials such as borosilicate glass and aluminosilicate glass can be used, in conjunction with high mechanical strength and high thermal conductivity ceramic fillers such as aluminum oxide, silicon carbide, silicon nitride, etc., in the manufacturing of hot plates, heating discs and far-infrared emitters that contain internally embedded heating circuit.

With the above-mentioned advantages, composite ceramic/glass substrates certainly have a very promising potential. However, due primarily to their inherent lack of mechanical strength, the applicability of composite ceramic/glass substrates is actually quite limited.

One of the reasons for the limited applicability of ceramic/glass based articles is that, due to its fragility, any surface defect caused by, for example, minor cracking or scratching will grow inwardly resulting in a total failure of the ceramic/glass based article. The growth of surface defect becomes more profound under a tensile stress. To avoid the occurrence of such failure, ceramic/glass and/or glass based materials are strengthened, typically by imparting a compressive stress at the surface thereof to suppress the growth of surface defects. In the presence of such compressive stress, In order to counter such compressive stress, a greater measure of tensile stress will be required in order for the surface defects to grow. The existence of such compressive stress, therefore, suppresses the growth of surface defects and improves the strength of the ceramic/glass based articles.

Several methods have been disclosed in the prior art to form the compressive stress at the surface of glass material. Generally they can be classified into five major types: ion exchange method; thermal tempering method, controlled surface crystallization method; laminating method; and surface coating method.

Ion exchange method was discussed, for example, in U.S. Pat. No. 4,726,981, in which strengthened glass articles are prepared by contacting glass bodies, at a temperature above the annealing point of the glass, with a source of $Li^+$ions to replace part of the $Na^+$ions and, if present, $K^+$ions in a surface layer with a corresponding amount of $Li^+$ions and to react the $Li^+$ions with $Al_2O_3$ and $SiO_2$ in the surface layer to form crystallites of beta-quartz solid solution nucleated by $TiO_2$ and/or $ZrO_2$. The content of the '981 patent is incorporated by reference. Ion exchange method has the advantage that it involves a relatively mature technology therefore has a wide range of applicability. It can be applied not only to glass materials, but crystalline materials as well. Its disadvantages are that distortion can result if article is too thin, and that salt particles often adhere to the surface thereof after the heat treatment process thus causing pollution problems. The ion exchange method also has the disadvantage that it is not applicable to articles that contain electronic parts and/or circuit.

Thermal tempering method involves a relatively simple procedure. After the glass article is formed, cold air is blown upon the hot glass article to reduce its surface temperature to that below its annealing temperature.

Because the surface layer cools faster, it is subject to relatively greater volumetric contraction. However, since the inner layer is at a higher temperature and a viscous flow is still present, no tensile stress is exerted on the outer layer. The glass article is then cooled at a lower rate. Because the surface layer is at a lower temperature at the beginning of the second stage, it has a relatively small extent of volumetric contraction relative to the inner layer. This causes a compressive stress to be exerted on the surface layer. Because the temperature of the surface is lower than the annealing temperature during the second cooling stage, such compressive stress can be preserved to provide the strengthening effect. This method is typically applicable to glass or glass-rich articles with simple geometry. However, this method is relatively difficult to control and the strengthening effect disappears at elevated temperatures, thus it only has a relatively narrow range of areas in which it can be applied.

Controlled surface crystallization method has been discussed, for example, in U.S. Pat. Nos. 4,341,543 and 4,218,512, the content thereof is herein incorporated by reference. In '543, a method of making strengthened glass-ceramic articles is disclosed which comprises the steps of subjecting a glass article to vapors of $SO_2$ and thereafter heat treating the glass article to cause crystallization in situ thereof. '512 discloses a similar method of strengthening glass-ceramic articles by creating a surface compressing layer by controlling the crystallization process to yield different crystalline forms at the surface and in the interior. Some of the major disadvantages of the controlled surface crystallization method include: difficulty in controlling the treatment process, variation in the physical and mechanical properties between different batches, and relatively poor reliability. Furthermore, the controlled surface crystallization method also suffers from the need to use a multiplicity of treatment steps and an assortment of unknown factors involved in the various steps, as well as the relatively high manufacturing cost. Also, this method can be applied only to a limited range of glass-ceramic materials and in a limited number of applications.

U.S. Pat. No. 3,649,440, whose content is incorporated by reference, teaches a method for supplemental strengthening of laminated articles of glass by forming a plurality of fused adjacent laminae by thermal tempering such as to greatly increase the impact resistance of the articles. Each lamina exhibits a state of stress opposite to that of the lamina contiguous thereto. The advantage of the laminating method is that the thickness of the strengthened layer and the compressive stress can be controlled by controlling the thickness and composition of glass laminae. However, the laminating method requires a relatively high treatment temperature (1,350° C.); therefore, it cannot be used in making glass articles that contain electronic parts or screen printing circuit. Furthermore, if the glass laminae are too thin, uniform thickness cannot be obtained; thus, the laminating method cannot be applied in the manufacturing of thin strengthened glass plates.

The surface coating method involves primarily depositing on the surface of sintered articles, using a chemical vapor deposition (CVD) or sputtering method, a material having lower thermal expansion coefficient. U.S. Pat. No. 4,781,970, whose content is incorporated by reference, discussed the surface coating method, by which ceramic articles are strengthened by forming a compressive material layer of amorphous silicon dioxide or refractory metal nitride on the surface of the article to be strengthened. One of the major advantages of the surface coating method is that the thickness of the strengthened layer can be made very thin; also, this method can be used in strengthening ceramic substrates containing electronic parts and circuit. However, the surface coating method has several disadvantages such as: the thickness of the strengthened layer is limited (it cannot exceed several microns), and the strengthened article does not tolerate any surface scratching. These disadvantages severely limited the applicability of the surface coating method.

All the methods disclosed in the prior art involve melting the raw material by heating the same to a temperature above the melting point thereof, cooling the molten material to form glass plates or other shapes, then applying surface treatment to form the compressive stress and thus provide the strengthen effect.

There exist, however, other techniques which do not require the melting of the glass material to form glass or glass/ceramic articles. In these techniques, glass and/or glass/ceramic powders are used to prepare precursory substrates having a desired shape using a variety of powder forming methods such as tape casting, dry pressing, extrusion, or injection molding method, etc. The precursory substrates are then sintered at a temperature substantially below the melting temperature of glass to form densified composite ceramic/glass articles. The ceramic/glass articles prepared from the sintering process, however, do not have adequate strength; generally the maximum strengths of sintered ceramic/glass articles are only about 150–180 MPa. Inadequate strength is a major weakness of using the sintering process to manufacture glass/ceramic articles.

SUMMARY OF THE INVENTION

Having discussed the importance of ceramic/glass materials and the disadvantages of the prior art methods in the strengthening thereof, the primary object of the present invention, therefore, is to develop a method that will improve the mechanical strength of ceramic/glass based material, while avoiding many of the shortcoming existing in the prior art methods. More particularly, the primary object of the present invention is to develop an improved method to impart a compressive stress at the surface of a glass based material to prevent growth of any surface defects thus improve the mechanical strength of the glass based material.

The method for strengthening ceramic/glass substrates disclosed in the present invention comprises the steps of:

(1) preparing at least first and second slurries, said at least first and second slurries comprising, respectively, at least first and second ceramic/glass powder mixtures, said first ceramic/glass powder mixture would exhibit a higher thermal expansion coefficient after sintering than said second ceramic/glass powder mixture, said first and second slurries further comprising other additives such as solvent, binder, dispersion agent, plasticizer, etc.;

(2) preparing at least first and second precursory substrates from corresponding at said first and second slurries obtained in step (1);

(3) preparing a laminated precursory substrates by stacking and applying pressure and heat thereupon, a plurality of said at least first and second precursory substrates obtained in step (2) in such a manner that at least one of said first precursory substrate is sandwiched between at least two of said second precursory substrates; and (4) sintering said laminated precursory substrates by placing the same in a furnace and applying heat thereto.

The present invention discloses a method by which the mechanical strength of glass based material can be substantially increased. The process disclosed in the present invention involves relatively simple procedure, can be easily controlled and is inexpensive to implement.

With the present invention, the thickness of the strengthening layer can be significantly increased. The process disclosed in the present invention also allows the thickness of the strengthening layer to be easily and precisely controlled.

The process disclosed in the present invention can also be applied to manufacturing ceramic/glass based multilayer substrates that contain conductor circuits and/or other electronic components.

Another advantage of the process disclosed in the present invention is that it can be applied to a great variety and range of ceramic and glass materials and with an improved range of applications.

In the present invention, the term "ceramic/glass" is used to indicate a composite material containing a glass matrix and ceramic or other glass particles which are added as fillers. Fillers are added to strengthen the glass matrix or change the physical and/or chemical properties thereof, or both. The weight percentage of the fillers can be 0 to about 80 wt % of the ceramic/glass composite. If the weight percent of the filler is 0 wt %, then the substrate is a glass material.

In the process disclosed in the present invention, a plurality of precursory ceramic/glass substrates are prepared from glass and ceramic powders which are then sintered to form the final product. The precursory ceramic/glass substrates are prepared according to different formulas and contain different compositions in such a manner that they will have different thermal expansion coefficients after sintering. The thermal expansion coefficients can be calculated from the composition of each precursory substrate, or they can be obtained empirically by actual measurement after the products are sintered.

After the precursory ceramic/glass substrates are prepared, they are laminated into a multilayer structure such that those with the smallest thermal expansion coefficient are placed as the outermost layer and at least one precursory substrate with a higher thermal expansion coefficient is sandwiched between the outer layers of other precursory substrates of lower thermal expansion coefficient. The laminated precursory ceramic/glass substrates are then subject to high temperature treatment. During the high temperature treatment stage, because of the softening and the presence of viscous flow of the glass, the laminated multilayer precursory substrates will be sintered and densified to form an integral body. The rheological property of the softened glass will also neutralize most of the stress between different layers during the sintering step. However, the stress would persist after the temperature of ceramic/glass material drops below it softening point. During the period of temperature decrease, because of its lower thermal expansion coefficient, the outer layer will contract at a lesser extent. On the other hand, because of its greater thermal expansion coefficient, the inner layer will contract at a relatively greater extent. A compressive stress is therefore exerted by the inner layer on the outer layer. Such a compressive stress becomes permanently imparted after the ceramic/glass article is cooled to room temperature and provides the effect of retarding any growth of surface cracks and thus strengthening the substrates.

The method of strengthening ceramic/glass substrates of the present invention can be applied to any manufacturing process that uses precursory substrates made from powders using a sintering technique. In applying the principle disclosed in the present invention, the key step is to place one or more precursory substrates with a lower thermal expansion coefficient in the outermost layer. The extent to which the final product is strengthened depends on many factors such as: the strength of the starting material, the thickness of the surface layer affected by the compressive stress, the difference in thermal expansion coefficients between the outer and inner layers, the amount and sizes of the flaws contained in the material, etc. However, no matter how these factors may vary, as long as there exists a compressive stress existed on the surface layer, the material is strengthened.

The process disclosed in the present invention is particularly suited for the strengthening of ceramic/glass plates, especially multi-layer ceramic/glass substrates, which can be used in the manufacturing of multilayer ceramic/glass substrates for electronic packages, or in the manufacturing of computer hard discs with electromagnetic shielding.

The main advantage of the present invention is that, because the ceramic/glass substrates are prepared from a multiplicity of precursory substrates which are subject to the sintering process at the same time, the compressive stress, the dimensions and physical and chemical properties of each layer, and any interlayer forces can be precisely calculated and controlled. This advantage thus allows the strengthened products from the process disclosed in the present invention exhibit superior qualities in applications where precision and dimensional stability are crucial. The process disclosed in the present invention also assures excellent quality control of the final strengthened products.

DETAILED DESCRIPTION OF PREFERRED EMBODIMENTS

Figure 1:
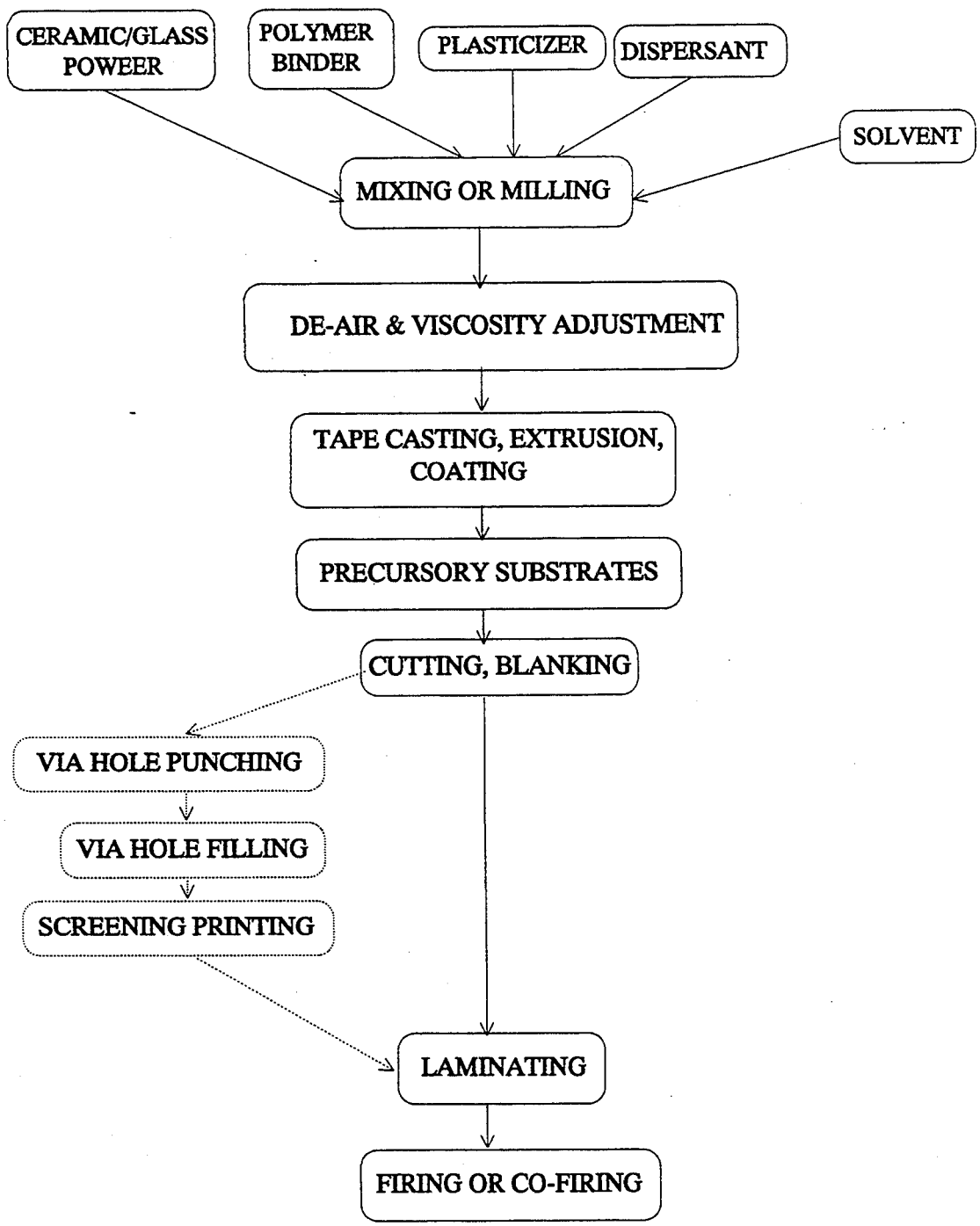
FIG. 1 is a flowchart diagram of the process disclosed in the present invention.

As shown in FIG. 1, which is a flowchart diagram showing the process disclosed in the present invention, the present invention comprises the following steps:

Step 1: Preparing ceramic/glass slurry compositions which will exhibit different thermal expansion coefficients after sintering Two or more slurry compositions prepared from mixtures each contains a glass or ceramic powder, or mixture thereof, and a solvent, a polymeric binder resin, a dispersant, a plasticizer, and/or other appropriate additives that may be appropriate. Each mixture is thoroughly blended and milled using a ball mill, attrition bill, or ultrasonication, etc to homogenize the mixture. A plurality of homogeneous slurries are thus obtained.

Glass powders suitable for the present invention can contain the following components: silicon oxide; boron oxide ($B_2O_3$); oxides of alkali metals such as $Na_2O$, $K_2O$, $Li_2O$, etc.; oxides of alkaline earth metals such as MgO, CaO, BaO, etc; and other metal oxides such as $Al_2O_3$, PbO, $TiO_2$, $Bi_2O_3$, $Ni_2O_3$, $Nb_2O_5$, etc.

Ceramic powders suitable for the present invention can have the following components: aluminum oxide ($Al_2O_3$), quartz, zirconium oxide ($ZrO_2$), titanium oxide ($TiO_2$), boron nitride (BN), forsterite ($Mg_2SiO_4$), cordierite, magnesium oxide (MgO), silicon nitride ($Si_3N_4$) silicon carbide (SiC), fused silica, etc.

Solvent can be water, toluene, methanol, ethanol, n-butanol, isopropanol, methyl ethyl ketone, methyl isobutyl ketone, trichloroethane, acetone, or the mixture thereof.

A variety of polymeric binders, such as polyvinyl butyral (PVB), polyvinyl alcohol (PVA), methyl cellulose, ethyl cellulose, polymethyl methacrylate, acrylic resins, etc, can be used in the present invention. Suitable plasticizers include di-butyl phthalate (DBP), dioctyl phthalate (DOP), butyl benzyl phthalate (BBP), polyethylene glycol (PEG), etc. Suitable dispersants include fish oil, aliphatic acids, or benzene sulfonic acid, etc. A small amount of defoaming agent and/or viscosity adjusting agent can also be added to the slurry compositions.

Step 2: Preparing precursory ceramic/glass substrates and cut into appropriate sizes After the slurry compositions are prepared according to the method describe above, precursory ceramic/glass substrates can be made therefrom using a tape casting, extrusion, coating, or pressing technique. In tape casting or coating, the slurry is applied on a glass, metal or plastic surface using a doctor blade or coater to form a thin film having a uniform thickness. After drying, the slurry forms a precursory substrate. The preferred thickness of the precursory substrates is between about 0.01–1 mm. The precursory substrates are then cut into appropriate sizes for further fabrication, such as 2Δ–8″ circular disks or square plates.

Step 3: Lamination

In a preferred embodiment of the present invention, at least a precursory substrate having a greater thermal expansion coefficient after sintering is sandwiched between at least two precursory substrates having a smaller thermal expansion coefficient after sintering. If more than one strengthening layer is to be used, the various layers are stacked preferably in the order of decreasing thermal expansion coefficient from the inner layer to the outer layer.

The precursory ceramic/glass substrates are stacked to provide the required thickness. The stacked precursory ceramic/glass substrates are then laminated under pressure and temperature to form an integral piece. The preferred lamination temperature is 40°–120° C. and the preferred lamination pressure is 1,000–5,000 psi. The duration of lamination time should be about 1–20 minutes. The preferred thickness of the surface strengthening layer is about 0.05–0.5 mm; however, its thickness can be adjusted in accordance with the overall thickness of the final substrate to be obtained.

If the ceramic/glass substrates are to be used in the production of electronic packaging products, a plurality of via holes can be made using mechanical driller, laser puncher, or other appropriate means. The via holes are then filled with metal paste to form a conductor path. Interconnecting metal traces can be fabricated on each precursory substrate using screen printing technique.

Suitable metal pastes for via hole filling and/or screen printing can be prepared from various metal or alloy powders such as gold, silver, silver/palladium alloy, nickel, copper, etc.

Step 4: Sintering

After lamination, the precursory substrates are placed inside a furnace containing air or other controlled environment such as $N_2$ or $H_2$. The temperature in the furnace increases first at a rate of 1°–6° C./min until it reaches 400°–600° C. The furnace temperature remains constant at such temperature for 0.5–4 hours to remove the organic components in the precursory matrix (i.e., debindering). Thereafter, its temperature is increased at a rate of 2°–15° C./min until it reaches 600°–1,000° C. and stay at that temperature for about 0.5–4 hours to cause the ceramic/glass powder to become sintered and densifted. Then cooling means is applied to reduce the furnace temperature at a rate of 2°–15° C./min until room temperature is reached. With the process disclosed in the present invention, the strengthening effect is introduced in a naturally occurring process during the cooling stage; no additional heat treatment is required.

The present invention will now be described more specifically with reference to the following examples. It is to be noted that the following descriptions of examples including preferred embodiments of this invention are presented herein for purpose of illustration and description; it is not intended to be exhaustive or to limit the invention to the precise form disclosed.

Examples 1–3 (strengthening of glass substrates)

Two glass powders (glass A and glass B), which would exhibit different thermal expansion coefficients after sintering, were blended, respectively, with acrylic resins, dioctyl phthalate, and trichloroethane, and subject to a ball mill for 24 hours to form two homogeneous slurries. Table 1 shows the compositions of glass A and glass B. The glass powders had an average particle size of about 3 μm. The compositions of the slurries were summarized in Table 2. The slurries were tape cast onto a polymer film. After drying, two groups of precursory substrates were prepared, each having a thickness of about 0.1 mm. Thirty to thirty two of these precursory substrates were stacked. Example 1 used precursory substrates prepared Glass A, which has a lower thermal expansion coefficient, while Example 2 used precursory substrates prepared from glass B, which has a higher thermal coefficient. Example 3 was a sandwiched structure containing glass A and glass B; the top and bottom layers were precursory substrates prepared from glass A, whereas precursory substrates prepared from glass B were in the inner layer. The thickness of each of the top and bottom layers was 200 μm, and the thickness of the inner layer was 2.8 mm.

The stacked precursory substrates were laminated under 2000 psi and at 70° C. for 10 minutes. The laminated precursory substrates were placed in a furnace and heated at a rate of 2° C./min until its temperature reached 500° C., and was maintained at that temperature for two hours to remove organic components. Then the temperature of the furnace was raised to 650° C. for one hour to effect sintering. The strengths of the sintered substrates are summarized in Table 3. From Table 3, it is seen that the strength of the sandwiched substrate of the present invention was doubled relative to the single-component glass substrates. Thus, the method disclosed in the present invention effectively improves the mechanical strength of glass substrates.

Examples 4-12 (strengthening of ceramic/glass substrates)

Various mixtures of ceramic and glass powders, which would exhibit different thermal expansion coefficients after sintering, were blended, respectively, with polyvinyl butyral binder, plasticizers comprising dioctyl phthalate and dibutyl phthalate, and a solvent mixture comprising isopropanol and methyl ethyl ketone, and subject to a ball mill for 20 hours to form corresponding homogeneous slurties. The slurry formulations are shown in Table 4. The compositions of the ceramic/glass powder mixtures and their representative symbols are summarized in Table 5. The slurries were respectively tape cast onto a polymer film. After drying, a plurality of precursory substrates were prepared from each ceramic/glass formulation, each precursory substrate having a thickness of about 0.1 mm. The precursory substrates were cut into a size of 5 cm×5 cm. 30 to 32 of such precursory substrates were stacked and laminated under 2000 psi and at 70° C. for 10 minutes. The laminated substrates were placed in a furnace and heated at a rate of 3° C./min until its temperature reached 600° C., and was maintained there for two hours to remove organic components. Then the temperature of the furnace was raised to 900° C. for one hour to effect sintering. The strengths of the sintered substrates from Examples 4 through 9 are summarized in Table 5.

In Table 5, G represents a glass phase, whose composition is shown below:

| | |
|---|---|
| $SiO_2$ | 57.1% |
| $Al_2O_3$ | 10.2% |
| $B_2O_3$ | 22.7% |
| $E_2O$ | 4.5% |
| RO | 5.5% | and E represents alkaline metals; R represents alkaline earth metals. Other symbols have the following meanings:
A: alumina
C: cordierite
F: forsterite
Q: quartz
S: fused silica Examples 9-12

The lamination and sintering conditions in preparing ceramic/glass substrates were similar to those in Examples 4-8, except that the substrates were made by sandwiching ceramic/glass precursory substrates of varying thermal expansion coefficients. In all the examples, the thickness of each of the strengthening top and bottom layers was 200 μm, and the thickness of the inner layer was 2.8 mm. The properties of the ceramic/glass substrates after sintering are summarized in Table 6. Examples 9-10 indicate that strengthening effect can be readily obtained with the same inner layer material but with different types of outer materials. Relative to a sintered substrate without the strengthening outer layer (i.e., a substrate prepared from the same type precursory substrates), the sandwiched substrates in Example 9-10 improved the mechanical strength thereof by about 50-60%. Examples 11-12 indicate that strengthening effect can be readily obtained with the same outer layer material but with different types of inner layer material. Relative to a substrate without the strengthening outer layer, the sandwiched substrates in Example 11-12 improved the mechanical strength thereof by about 20-50%.

The present invention discloses a procedure for strengthening ceramic/glass articles by sintering a plurality of precursory substrates having varying thermal expansion coefficients. No other heat treatment is required. The present invention improves the strength of ceramic/glass substrates by at least 30-100%. Not only that the process disclosed in the present invention is effective, it also involves a relatively simple procedure, which can be easily controlled and is relatively inexpensive. In addition to these advantages, the present invention allows a substantially increase in the thickness of the strengthened layer, to about 500 μm. This is superior to other strengthening methods disclosed in the prior art, such as ion exchange method, thermal tempering method, controlled surface crystallization method, laminating method, and surface coating method, by which the maximum thickness of the strengthened layer can only reach teens of microns. The process disclosed in the present invention is also particularly suitable for strengthening ceramic/glass substrates that contain electronic components or circuits.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

TABLE 1

| | Glass A | Glass B |
|---|---|---|
| $SiO_2$ | 54.8 | 56.1 |
| $B_2O_3$ | 23.2 | 16.1 |
| $Al_2O_3$ | 6.1 | 10.5 |
| $E_2O$ | 10 | 17.4 |
| RO | 5.9 | 4.9 |

TABLE 2

Glass A: 50 g   DOP: 5 g; trichloroethane: 85 cc; acrylic resin: 8 g
Glass B: 50 g

TABLE 3

| Example No. | 1 | 2 | 3 |
|---|---|---|---|
| Outer layer | Glass A | Glass B | Glass A |
| Inner layer | Glass A | Glass B | Glass B |
| Annealing temperature (°C.) | 565 | 588 | — |
| Thermal expansion coefficient 40-600° C. (X $10^{-7}$) | 71 | 106 | — |
| Bending strength (Mpa) | 74.8 | 74.2 | 144.4 |

TABLE 4

| Ceramic powder | PVB | DOP | DBP | Isopropanol | Methyl ethyl ketone |
|---|---|---|---|---|---|
| 100 g | 6 g | 2 g | 2 g | 40 c.c. | 40 c.c. |

TABLE 5

| Example No. | 4 | 5 | 6 | 7 | 8 |
|---|---|---|---|---|---|
| Representative Symbol | GAS | GC | GA | GAF | GAQ |
| Borosilicate glass | 50 | 50 | 50 | 50 | 50 |
| Alumina | 25 | — | 50 | 25 | 25 |
| Fused $SiO_2$ | 25 | — | — | — | — |
| Cordierite | — | 50 | — | — | — |
| Forsterite | — | — | — | 25 | — |
| Quartz | — | — | — | — | 25 |
| Thermal expansion coefficient 40–600° C. (X $10^{-7}$) | 50.9 | 52.1 | 76.3 | 70.2 | 101.7 |
| Bending strength (MPa) | 147.8 | 77.8 | 154.2 | 177.5 | 150.7 |

TABLE 6

| Example No. | 9 | 10 | 11 | 12 |
|---|---|---|---|---|
| Strengthening outer layer | GC | GAS | GAS | GAS |
| Inner layer | GA | GA | GAF | GAQ |
| Difference in thermal expansion coefficient (X $10^{-7}$) | 24.2 | 25.4 | 19.3 | 50.8 |
| Bending strength (MPa) | 228.3 | 248.5 | 216.9 | 222.6 |
| Improvement in bending strength (%) | 48 | 61 | 22 | 48 |

What is claimed is:

1. A method for strengthening ceramic/glass substrates comprising the steps of:
   (1) preparing at least first and second slurries, said first and second slurries comprising, respectively, first and second ceramic/glass powder mixtures, wherein said first and second ceramic/glass mixtures comprising about 20–100 wt % glass material and about 0–80 wt % ceramic material and said first ceramic/glass powder mixture would exhibit a greater thermal expansion coefficient after sintering than said second ceramic/glass powder mixture said first and second slurries further comprising other additives such as solvent, binder, dispersion agent, plasticizer;
   (2) preparing at least first and second precursory substrates from corresponding said first and second slurries from step (1);
   (3) preparing a laminated precursory substrate under a laminating condition by stacking and applying heat and pressure thereon, a plurality of said at least first and second precursory substrates from step (2) in such a manner that at least one of said first precursory substrate is sandwiched between at least two of said second precursory substrates; and
   (4) sintering said laminated precursory substrate under a sintering condition by placing the same in a furnace and applying heat thereto.

2. The method for strengthening ceramic/glass substrates of claim 1 wherein said glass material comprises silicon oxide; boron oxide ($B_2O_3$); oxides of the alkali metals oxides of the alkaline earth metals and $Al_2O_3$, PbO, $TiO_2$, $Bi_2O_3$, $Ni_2O_3$, $Nb_2O_5$; or a mixture thereof.

3. The method for strengthening ceramic/glass substrates of claim 1 wherein said ceramic material comprises a component, or mixture thereof, selected from the group consisting essentially of aluminum oxide ($Al_2O_3$), quartz, zirconium oxide ($ZrO_2$), titanium oxide ($TiO_2$), boron nitride (BN), forsterite ($Mg_2SiO_4$), cordierite, magnesium oxide (MgO), silicon nitride ($Si_3N_4$) silicon carbide (SIC), and fused silica.

4. The method for strengthening ceramic/glass substrates of claim 1 wherein said ceramic/glass powders have an average diameter of about 0.1–10 μm.

5. The method for strengthening ceramic/glass substrates of claim 1 wherein said ceramic/glass powders have an average diameter of about 0.5–4 μm.

6. The method for strengthening ceramic/glass substrates of claim 1 wherein said at least first and second precursory substrates are prepared in step (2) using tape casting, coating, extrusion, dry pressing, or injection molding method.

7. The method for strengthening ceramic/glass substrates of claim 1 wherein said precursory substrates have a thickness in the range of 0.01–1 mm.

8. The method for strengthening ceramic/glass substrates of claim 1 wherein said precursory substrates have a thickness in the range of 0.05–0.5 mm.

9. The method for strengthening ceramic/glass substrates of claim 1 wherein said laminating condition has a lamination temperature of 40°–120° C. and a lamination pressure is 1,000–5,000 psi.

10. The method for strengthening ceramic/glass substrates of claim 1 wherein said sintering step comprises the following steps:
    (a) placing said laminated precursory substrates inside a furnace containing air or other controlled environment such as $N_2$ or $H_2$;
    (b) raising temperature in the furnace at a rate of 1°–6° C./min until it reaches 400°–600° C., maintaining at such temperature for 0.5–4 hours;
    (c) raising temperature in the furnace at a rate of 2°–15° C./min until it reaches 600°–1,000° C. and staying at that temperature for about 0.5–4 hours; and
    (d) applying cooling means to reduce the furnace temperature at a rate of 2°–15° C./min until room temperature is reached.

11. The method for strengthening ceramic/glass substrates of claim 1 whereby said strengthened ceramic/glass substrates are fabricated for electronic packaging applications, and said method further comprises the steps of:
    (a) forming a plurality of via holes using laser driller, laser puncher, or other appropriate means;
    (b) filling said via holes with metal paste to form a conductor path; and
    (c) preparing interconnecting metal traces with a screen printing of metal paste.

12. The method for strengthening ceramic/glass substrates of claim 11 wherein said metal pastes contain metal powder selected from the group consisting of gold, silver, silver/palladium alloy, nickel, and copper.

* * * * *